(12) United States Patent
Saito

(10) Patent No.: US 6,896,974 B2
(45) Date of Patent: May 24, 2005

(54) MAGNETIC FIELD SENSOR AND MAGNETIC DISK APPARATUS

(75) Inventor: Kazuhiro Saito, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/465,859

(22) Filed: Jun. 20, 2003

(65) Prior Publication Data

US 2004/0001976 A1 Jan. 1, 2004

(30) Foreign Application Priority Data

Jun. 28, 2002 (JP) .................................. 2002-190660

(51) Int. Cl.⁷ ............................................. G11B 5/27
(52) U.S. Cl. ................... 428/636; 428/661; 428/664; 428/686; 428/692; 428/215; 428/216; 360/324.1
(58) Field of Search ......................... 428/636, 661, 428/664, 686, 692, 215, 216; 360/324.1

(56) References Cited

U.S. PATENT DOCUMENTS 5,491,600 A * 2/1996 Chen et al. ................ 360/322
5,793,550 A 8/1998 Nepela et al.
5,883,764 A * 3/1999 Pinarbasi .................... 360/322
6,178,074 B1 * 1/2001 Gill ......................... 360/324.2
6,185,078 B1 * 2/2001 Lin et al. ................ 360/324.12
6,632,474 B1 * 10/2003 Horng et al. ................ 427/131
2004/0075954 A1 * 4/2004 Parker et al. ................ 360/322

FOREIGN PATENT DOCUMENTS

JP  10-74306  3/1998

* cited by examiner

*Primary Examiner*—Kevin M. Bernatz
(74) *Attorney, Agent, or Firm*—Pillsbury Winthrop, LLP

(57) ABSTRACT

A magnetic field sensor has a pair of magnetic shields serving as a negative electrode and a positive electrode, respectively, a magnetoresistive element arranged between the pair of magnetic shields, a nonmagnetic conductive layer for the negative electrode arranged between the magnetic shield for the negative electrode and the magnetoresistive element and including a first metal layer formed in contact with the magnetoresistive element and a second metal layer formed in contact with the first metal layer, and a nonmagnetic conductive layer for the positive electrode arranged between the magnetic shield for the positive electrode and the magnetoresistive element and formed of a first metal layer, the first metal layer containing at least one metal selected from the group consisting of Ta, Ti, Cr, V, Mo and W.

10 Claims, 3 Drawing Sheets

MAGNETIC FIELD SENSOR AND MAGNETIC DISK APPARATUS

CROSS-REFERENCE TO RELATED APPLICATIONS

This application is based upon and claims the benefit of priority from the prior Japanese Patent Application No. 2002-190660, filed Jun. 28, 2002, the entire contents of which are incorporated herein by reference.

BACKGROUND OF THE INVENTION

1. Field of the Invention

The present invention relates to a magnetic field sensor and a magnetic disk apparatus.

2. Description of the Related Art

In a magnetic disk apparatus such as an HDD, it is always required to improve the recording density. With improvement in the recording density, a recording bit size recorded in a magnetic disk is diminished, which weakens a magnetic field. Such being the situation, an improvement in sensitivity is required for a magnetic field sensor (reproduction head) for detecting the signal magnetic field.

A typical magnetic field sensor at the present time has a structure that a giant magnetoresistive element (GMR element) is arranged between a pair of magnetic shields where the GMR element is used in such a manner that a sense current is flowed in the plane thereof (current-in-plane, i.e., CIP type).

On the other hand, it is reported that a GMR element in which a sense current is flowed perpendicular to the plane of the GMR element (current-perpendicular-to-plane, i.e., CPP type) permits a magnetoresistance ratio higher than that obtained by the CIP type GMR element. Likewise, it is reported that a tunneling magnetoresistive element (TMR element) also permits a high magnetoresistance ratio. Under the circumstances, it is being studied to use the CPP type GMR element or the TMR element.

A shield type magnetoresistive head (reproduction head) using a CPP type magnetoresistive element is constructed such that a lower magnetic shield, a nonmagnetic conductive layer, a magnetoresistive element, a nonmagnetic conductive layer, and an upper magnetic shield are formed on a substrate. The magnetoresistive element has a basic structure comprising a magnetization free layer (free layer), a nonmagnetic intermediate layer, a magnetization pinned layer (pinned layer), and an antiferromagnetic layer. In the GMR element, a nonmagnetic conductive material such as Cu is used for the nonmagnetic intermediate layer. In the TMR element, an insulating material such as alumina is used for the nonmagnetic intermediate layer. Each of the lower magnetic shield and the upper magnetic shield is formed of a soft magnetic material and serves as an electrode (a positive electrode or a negative electrode) for flowing a sense current into the magnetoresistive element through the nonmagnetic conductive layer. The lower magnetic shield and the upper magnetic shield are connected to a constant current or constant voltage power source such as a head amplifier, and a change in resistance of the magnetoresistive element is detected as a change in voltage or a change in current.

Conventionally, each nonmagnetic conductive layer arranged between the lower magnetic shield and the magnetoresistive element or between the upper magnetic shield and the magnetoresistive element is formed of a stacked film such as Ta/Au/Ta. Au, which has a high electrical conductivity and is excellent in heat radiation performance, contributes to suppress heat of the element. A metal material having the characteristics similar to those of Au includes Ag and Cu. In order to suppress the heat generated by the element, a stacked structure including a thick Au layer (or a thick Ag or Cu layer) is used for the nonmagnetic conductive layer in any of the positive electrode and the negative electrode.

However, it has been found that, in the CPP type magnetoresistive element, Au, Ag or Cu, which is a metal material forming a nonmagnetic conductive layer, having a high electrical conductivity and exhibiting a high heat radiation performance, is likely to be subjected to electromigration with the flow of the current. The electromigration exhibits directionality, where the migration of Au, Ag or Cu from the nonmagnetic conductive layer for the positive electrode toward the magnetoresistive element poses problems. Particularly, if the magnetoresistive element generates heat with the flow of the current under the condition that the element is exposed to a high temperature, Au, Ag or Cu forming the nonmagnetic conductive layer for the positive electrode diffuses into the magnetoresistive element, with the result that the magnetoresistance ratio is lowered. Also, it is possible for the nonmagnetic conductive layer for the positive electrode to finally break. It should be noted that the electromigration is made prominent with decrease in the thickness of the nonmagnetic conductive layer as the gap between the lower magnetic shield and the upper magnetic shield is decreased with improvement in the recording density.

A technique to alter polarities of the electrodes periodically, which is disclosed in U.S. Pat. No. 5,793,550, may be effective to suppress the electromigration. However, if the polarities of the electrodes are altered periodically, the current magnetic field applied to the free layer in the magnetoresistive element is also altered periodically, with the result that performance for magnetic field detection of the magnetoresistive element is adversely affected. Also, the magnetoresistive element cannot be operated while the polarities of the electrodes are altered, which leads to a poor response. Therefore, it is impractical to employ the particular technique.

BRIEF SUMMARY OF THE INVENTION

According to an aspect of the present invention, there is provided a magnetic field sensor comprising: a pair of magnetic shields arranged apart from each other with a gap and serving as a negative electrode and a positive electrode, respectively; a magnetoresistive element arranged between the pair of magnetic shields and including a magnetization free layer, a nonmagnetic intermediate layer, a magnetization pinned layer and an antiferromagnetic layer; a nonmagnetic conductive layer for the negative electrode arranged between the magnetic shield for the negative electrode and the magnetoresistive element and including a first metal layer formed in contact with the magnetoresistive element and a second metal layer formed in contact with the first metal layer, the first metal layer containing at least one metal selected from the group consisting of Ta, Ti, Cr, V, Mo and W, and the second metal layer containing at least one metal selected from the group consisting of Au, Ag and Cu; and a nonmagnetic conductive layer for the positive electrode arranged between the magnetic shield for the positive electrode and the magnetoresistive element and formed of a first metal layer, the first metal layer containing at least one metal selected from the group consisting of Ta, Ti, Cr, V, Mo and W.

The magnetic disk apparatus according to embodiments of the present invention comprises a magnetic disk and a magnetic field sensor arranged so as to face the magnetic disk, the magnetic field sensor being any of the types described above.

DETAILED DESCRIPTION OF THE INVENTION

Figure 1:
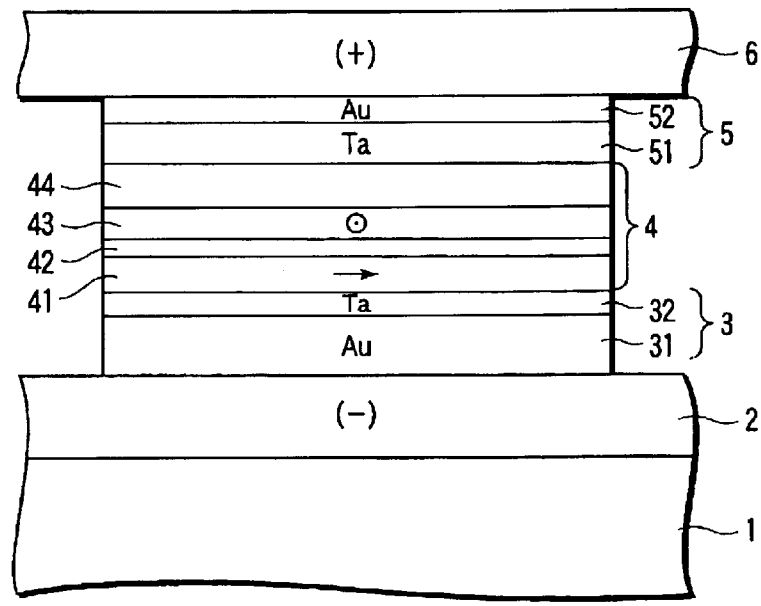
FIG. 1 is a plan view showing the magnetic field sensor according to Example 1 of the present invention.

Embodiments of the present invention will now be described.

The magnetic field sensor according to each embodiment of the present invention comprises a pair of magnetic shields arranged apart from each other with a gap, and a magnetoresistive element arranged between the pair of magnetic shields and including a magnetization free layer, a nonmagnetic intermediate layer, a magnetization pinned layer and an antiferromagnetic layer. A sense current is allowed to flow in a direction perpendicular to the plane of the magnetoresistive element.

The magnetoresistive element includes a magnetization free layer, a nonmagnetic intermediate layer, a magnetization pinned layer and an antiferromagnetic layer, which are stacked one upon the other. It is possible for the magnetoresistive element to be a giant magnetoresistive element (GMR element) or a tunneling magnetoresistive element (TMR element).

A ferromagnetic material such as $Co_{90}Fe_{10}$ or $Co_{90}Fe_{10}/Ni_{80}Fe_{20}$ is used for the magnetization free layer.

It is possible for the magnetization pinned layer to be formed of a ferromagnetic layer or a stacked structure of a ferromagnetic layer, an exchange coupling layer and a ferromagnetic layer. A ferromagnetic material such as $Co_{90}Fe_{10}$ or $Co_{90}Fe_{10}/Ni_{80}Fe_{20}$ is used for the ferromagnetic layer. A material such as Ru or Cr is used for the exchange coupling layer, which is designed to permit the magnetizations of the upper and lower ferromagnetic layers to be antiferromagnetically coupled with each other.

A Mn-based antiferromagnetic material such as PtMn or IrMn is used for the antiferromagnetic layer, which serves to permit the magnetization of the ferromagnetic layer (magnetization pinned layer) to be pinned in one direction. Incidentally, in the case of using an underlayer formed of NiFe or NiFeCr for promoting crystal growth of the antiferromagnetic layer, the particular underlayer is regarded as a part of the antiferromagnetic layer.

A nonmagnetic metal layer such as a Cu layer is used as the nonmagnetic intermediate layer in the case of a GMR element, and an insulating layer such as an alumina layer is used as the nonmagnetic intermediate layer in the case of the TMR element.

In the magnetic field sensor according to each embodiment of the present invention, the nonmagnetic conductive layer for the negative electrode between the magnetic shield for the negative electrode and the magnetoresistive element and the nonmagnetic conductive layer for the positive electrode between the magnetic shield for the positive electrode and the magnetoresistive element are improved so as to suppress electromigration. Particularly, the nonmagnetic conductive layer for the positive electrode is improved for suppressing the electromigration.

Here, the metal materials used for the nonmagnetic conductive layer for the positive electrode or for the negative electrode are classified into a first metal material that is unlikely to bring about the electromigration and a second metal material that tends to bring about the electromigration easily. The first metal material that is unlikely to bring about the electromigration includes Ta, Ti, Cr, V, Mo and W. It is possible for the first metal material to be an alloy or to be a stacked structure including two or more layers. The second metal material that tends to bring about the electromigration easily includes Au, Ag and Cu. It is possible for the second metal material to be an alloy or to be a stacked structure including two or more layers.

Concerning the nonmagnetic conductive layer for the negative electrode included in the magnetic field sensor according to each embodiment of the present invention, it is desirable for the second metal layer exhibiting a high electrical conductivity and a high heat radiation performance to be thicker than the first metal layer, in order to suppress heat generated by the element.

In the magnetic field sensor according to the first embodiment of the present invention, the nonmagnetic conductive layer for the positive electrode is formed of the first metal layer alone without using the second metal layer.

In the magnetic field sensor according to the second embodiment of the present invention, the nonmagnetic conductive layer for the positive electrode is omitted so as to permit the magnetoresistive element to be formed in direct contact with the magnetic shield for the positive electrode. In the case of this embodiment, the antiferromagnetic layer included in the magnetoresistive element, having a stacked structure of antiferromagnetic layer/magnetization pinned layer/nonmagnetic intermediate layer/magnetization free layer, is formed in direct contact with the magnetic shield for the positive electrode.

In the magnetic field sensor according to each of the first and second embodiments of the present invention, the nonmagnetic conductive layer for the positive electrode does not include the second metal layer that tends to bring about the electromigration easily, or the nonmagnetic conductive layer for the positive electrode is omitted. As a result, it is possible to effectively suppress the electromigration during operation of the magnetic field sensor under high temperatures. Incidentally, where the nonmagnetic conductive layer for the positive electrode does not include the second metal layer, the electrical conductivity is lowered so as to increase heat generation to some extent. However, the heat generation is not so high that poses problems.

In the magnetic field sensor according to the third embodiment of the present invention, a nonmagnetic conductive layer for the positive electrode including a first metal layer in contact with the magnetoresistive element and a second metal layer in contact with the first metal layer is formed, in which the relationship in thickness between the first metal layer and the second metal layer is defined so as to suppress the electromigration.

To be more specific, where the thickness of the first metal layer is 1 nm or less, the thickness of the second metal layer should not be greater than the thickness of the first metal layer.

Where the thickness of the first metal layer falls within a range of between 1 nm and 10 nm, the thickness of the second metal layer should not be greater than the square of the thickness of the first metal layer divided by two.

Further, where the thickness of the first metal layer is 10 nm or more, the thickness of the second metal layer is not particularly limited. If the thickness of the first metal layer is 10 nm or more, the crystallinity of the first metal layer is improved and, thus, the first metal layer effectively performs as a barrier to diffusion of the second metal layer.

In the third embodiment, if the first metal layer and the second metal layer constituting the nonmagnetic conductive layer for the positive electrode satisfy any of the relations in thickness noted above, it is possible to effectively suppress the electromigration of the second metal layer during operation of the magnetic field sensor under high temperatures.

In the third embodiment, the nonmagnetic conductive layer for the positive electrode is not limited to the two-layered structure of first metal layer/second metal layer. Alternatively, it is also possible for the nonmagnetic conductive layer for the positive electrode to be of-a three-layered of first metal layer/second metal layer/first metal layer, or to be of a multi-layered structure including four or more layers. However, regardless of the type of the stacked structure employed for the nonmagnetic conductive layer for the positive electrode, it suffices to pay attention to only the relationship in thickness between the first metal layer in contact with the magnetoresistive element and the second metal layer in contact with the first metal layer when it comes to the function of suppressing the electromigration.

The first metal layer in contact with the magnetoresistive element may be formed in a single deposition process or in two deposition processes.

For example, a lower nonmagnetic conductive layer having a stacked structure of the second metal layer and the first metal layer is deposited on a lower magnetic shield, followed by processing the lower nonmagnetic conductive layer by a photolithography process. Then, the first metal layer is deposited on the lower nonmagnetic conductive layer as an underlayer of the magnetoresistive element, followed by depositing the magnetoresistive element on the first metal layer. In this case, the thickness of the first metal layer defined above means the sum of the thickness of the first metal layer formed in the deposition process of the lower nonmagnetic conductive layer and the thickness of the first metal layer formed as the underlayer of the magnetoresistive element.

Also, the magnetoresistive film is deposited, followed by depositing the first metal layer as a protective film on the magnetoresistive element and subsequently processing the protective film and the magnetoresistive film by a photolithography process. Then, the upper nonmagnetic conductive layer having a stacked structure of the first metal layer and the second metal layer is deposited on the protective film of the first metal layer. In this case, the thickness of the first metal layer defined above means the sum of the thickness of the first metal layer formed in the process of depositing the upper nonmagnetic conductive layer and the thickness of the first metal layer formed as the protective film of the magnetoresistive element.

In each case, it is possible to use two types of metal materials selected from the first metal materials in the two deposition processes. For example, it is possible to form the first metal layer as a stacked structure comprising two layers including a Ta layer and another layer formed of a metal material selected from the group consisting of Ti, Cr, V, Mo and W.

Also, the magnetic disk apparatus according to the embodiments of the present invention comprises the magnetic field sensor described above and, thus, the reproduction characteristics thereof are not deteriorated even during the operation under high temperatures. It follows that the magnetic disk apparatus exhibits an excellent reliability over a long period of time.

Examples of the present invention will now be described with reference to the accompanying drawings.

EXAMPLE 1

FIG. 1 is a plan view showing the construction of the magnetic field sensor (shield type magnetoresistive head) in this Example as viewed from the air-bearing surface (ABS). As shown in FIG. 1, on the substrate 1 formed of $Al_2O_3$—TiC, the lower magnetic shield 2, the nonmagnetic conductive layer 3, the GMR element 4, the nonmagnetic conductive layer 5, and the upper magnetic shield 6 are formed.

Each of the lower magnetic shield 2 and the upper magnetic shield 6 is formed of a soft magnetic film and acts as an electrode for supplying an electric current into the GMR element 4. In this Example, the lower magnetic shield 2 serves as a negative electrode and the upper magnetic shield 6 serves as a positive electrode.

The GMR element 4 includes the magnetization free layer 41, the nonmagnetic intermediate layer 42, the magnetization pinned layer 43 and the antiferromagnetic layer 44. The magnetization of the pinned layer 43 is pinned downward toward the ABS. A magnetic anisotropy is imparted to the free layer 41 along the ABS, and the magnetization of the free layer 41 is freely rotatable in accordance with a signal magnetic field so as to be rendered parallel or antiparallel to the magnetization of the pinned layer 43. The lower magnetic shield 2 and the upper magnetic shield 6 are connected to a constant current or constant voltage power source such as a head amplifier, and a change in resistance of the GMR element 4 is detected as a change in voltage or as a change in current.

The nonmagnetic conductive layer 3 for the negative electrode between the magnetic shield 2 for the negative electrode and the GMR element 4 has a stacked structure of the Au layer (second metal layer) 31 and the Ta layer (first metal layer) 32, in which the Ta layer 32 is in contact with the free layer 41 of the GMR element 4. It is possible to arrange a protective film formed of a first metal material such as Ta between the magnetic shield 2 for the negative electrode and the Au layer 31 in the nonmagnetic conductive layer 3 for the negative electrode.

The nonmagnetic conductive layer 5 for the positive electrode between the GMR element 4 and the magnetic shield 6 for the positive electrode has a stacked structure of the Ta layer (first metal layer) 51 and the Au layer (second metal layer) 52, in which the Ta layer 51 is in contact with the antiferromagnetic layer 44 of the GMR element 4. It is possible to arrange a protective film formed of a first metal material such as Ta between the Au layer 52 in the nonmagnetic conductive layer 5 for the positive electrode and the magnetic shield 6 for the positive electrode.

First, various magnetic field sensors were fabricated, each of which includes the nonmagnetic conductive layer 3 for the negative electrode having a stacked structure of an Au layer 31 having a thickness of 13 nm and a Ta layer 32 having a thickness of 3 nm and the nonmagnetic conductive layer 5 for the positive electrode having a stacked structure of a Ta layer 51 and an Au layer 52. As shown in Table 1, the thicknesses of the Ta layer 51 and the Au layer 52 were changed in various fashions.

Each of the magnetic field sensors thus fabricated was operated for several hours under high temperatures in order to examine occurrence of electromigration. The occurrence of the electromigration was judged from whether or not the element resistance was increased after operation of the magnetic field sensor for several hours. Table 1 shows the combinations of the thickness t1 of the Ta layer 51 and the thickness t2 of the Au layer 52 in the nonmagnetic conductive layer 5 for the positive electrode in which the electromigration was not brought about.

TABLE 1

Construction of nonmagnetic conductive layer for positive electrode with suppressed electromigration

| Thickness t1 of Ta layer 51 (nm) | Thickness t2 of Au layer 52 (nm) |
|---|---|
| 0.5 | 0, 0.2, 0.4 |
| 1 | 0.5, 0.7, 0.9 |
| 3 | 1, 3, 5 |
| 5 | 4, 6, 8, 10 |
| 8 | 9, 20, 27, 34 |
| 10 | 30, 50, 80, 100 |

The nonmagnetic conductive layer 3 for the negative electrode, including the Au layer 31 thicker than the Ta layer 32, was satisfactory in electrical conductivity, low in resistance, and excellent in heat radiation performance so as make it possible to suppress heat generation. On the other hand, where the thicknesses of the Ta layer 51 and the Au layer 52 constituting the nonmagnetic conductive layer 5 for the positive electrode were set to meet the combinations shown in Table 1, it was possible to suppress the electromigration of Au from the nonmagnetic conductive layer 5 for the positive electrode into the GMR element 4.

As apparent from Table 1, it is reasonable to summarize the relationship between the thickness t1 of the Ta layer 51 and the thickness t2 of the Au layer 52 as follows:

(1) Where t1 is 1 nm or less, i.e., $t1 \leq 1$ nm, t2 should not be greater than t1, i.e., $t2 \leq t1$;

(2) Where t1 falls within a range of between 1 nm and 10 nm, i.e., 1 nm$\leq t1 \leq$10 nm, t2 should not be greater than the square of t1 divided by two, i.e., $t2 \leq t1^2/2$; and (3) Where t1 is 10 nm or more, t2 is not particularly limited.

Next, various magnetic field sensors were prepared in which the thicknesses of the Au layer 31 and the Ta layer 32 constituting the nonmagnetic conductive layer 3 for the negative electrode were changed in various fashions, in order to examine occurrence of electromigration. Table 2 shows the combinations of the thickness of the Au layer 31 and the thickness of the Ta layer 32 constituting the nonmagnetic conductive layer 3 for the negative electrode in which the electromigration did not take place.

TABLE 2

Construction of nonmagnetic conductive layer for negative electrode with suppressed electromigration

| Thickness of Au layer 31 (nm) | Thickness of Ta layer 32 (nm) |
|---|---|
| 8 | 6 |
| 10 | 5 |
| 12 | 4 |
| 40 | 3 |

As shown in Table 2, if the Au layer 31 is thicker than the Ta layer 32 in the nonmagnetic conductive layer 3 for the negative electrode, it is possible to suppress the electromigration of Au from the nonmagnetic conductive layer 5 for the positive electrode, having a stacked structure of the Ta layer 51 and the Au layer 52 of the combination shown in Table 1, into the GMR element 4.

Further, it is effective to use Ag or Cu excellent in electrical conductivity as a second metal material in place of Au. It is also effective to use an alloy containing at least two of Au, Ag and Cu in place of Au.

EXAMPLE 2

Figure 2:
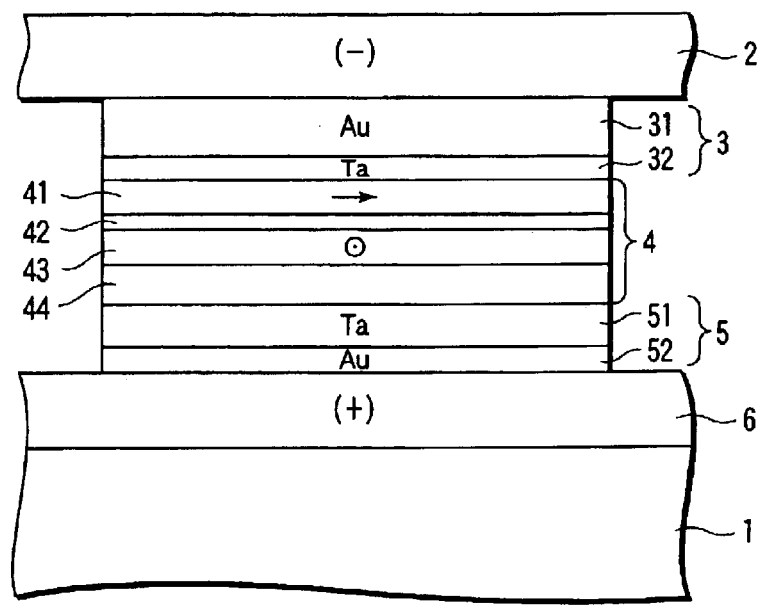
FIG. 2 is a plan view showing the magnetic field sensor according to Example 2 of the present invention.

FIG. 2 is a plan view showing the construction of the magnetic field sensor (shield type magnetoresistive head) in this Example as viewed from the air-bearing surface. As shown in FIG. 2, on the substrate 1 formed of $Al_2O_3$—TiC, the lower magnetic shield 6, the nonmagnetic conductive layer 5, the GMR element 4, the nonmagnetic conductive layer 3, and the upper magnetic shield 2 are formed. In this Example, the lower magnetic shield 6 serves as a positive electrode, and the upper magnetic shield 2 serves as a negative electrode.

The GMR element 4 has a stacked structure of the antiferromagnetic layer 44, the magnetization pinned layer 43, the nonmagnetic intermediate layer 42 and the magnetization free layer 41, in which the free layer 41 constitutes the uppermost layer. In this Example, in order to arrange the free layer 41 of the GMR element 4 in the central portion of the gap between the magnetic shield 6 for the positive electrode and the magnetic shield 2 for the negative electrode, the nonmagnetic conductive layer 5 for the positive electrode is formed thinner than the nonmagnetic conductive layer 3 for the negative electrode.

The nonmagnetic conductive layer 5 for the positive electrode between the magnetic shield 6 for the positive electrode and the GMR element 4 has a stacked structure of the Au layer (second metal layer) 52 and the Ta layer (first metal layer) 51, in which the Ta layer 51 is in contact with the antiferromagnetic layer 44 of the GMR element 4.

The nonmagnetic conductive layer 3 for the negative electrode between the magnetic shield 2 for the negative electrode and the GMR element 4 has a stacked structure of the Ta layer (first metal layer) 32 and the Au layer (second metal layer) 31, in which the Ta layer 32 is in contact with the free layer 41 of the GMR element 4.

Various magnetic field sensors were fabricated, each including the nonmagnetic conductive layer 3 for the negative electrode having a stacked structure of a Ta layer 32 having a thickness of 3 nm and an Au layer 31 having a thickness of 18 nm and the nonmagnetic conductive layer 5 for the positive electrode having a stacked structure of an Au layer 52 and a Ta layer 51. As shown in Table 1, the thickness t2 of the Au layer 52 and the thickness t1 of the Ta layer 51 were changed in various fashions. It has been found possible for the particular construction to suppress the electromigration as in Example 1.

EXAMPLE 3

Figure 3:
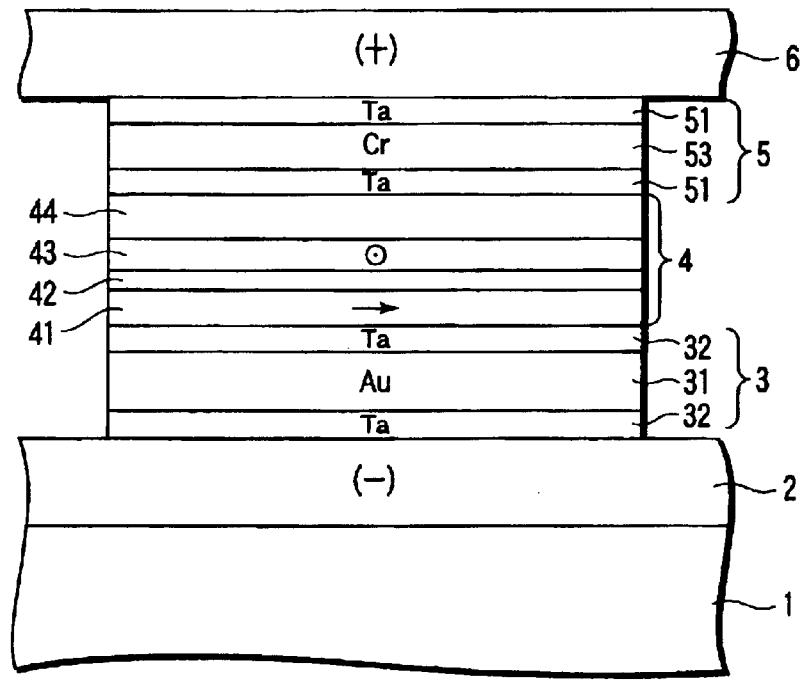
FIG. 3 is a plan view showing the magnetic field sensor according to Example 3 of the present invention.

FIG. 3 is a plan view showing the construction of the magnetic field sensor (shield type magnetoresistive head) in this Example as viewed from the air-bearing surface. As shown in FIG. 3, on the substrate 1 formed of $Al_2O_3$—TiC, the lower magnetic shield 2, the nonmagnetic conductive layer 3, the GMR element 4, the nonmagnetic conductive layer 5, and the upper magnetic shield 6 are formed. In this Example, the lower magnetic shield 2 serves as a negative electrode, and the upper magnetic shield 6 serves as a positive electrode.

The GMR element 4 includes the magnetization free layer 41, the nonmagnetic intermediate layer 42, the magnetization pinned layer 43 and the antiferromagnetic layer 44.

The nonmagnetic conductive layer 3 for the negative electrode between the magnetic shield 2 for the negative electrode and the GMR element 4 has a stacked structure of the Ta layer (first metal layer) 32, the Au layer (second metal layer) 31 and the Ta layer (first metal layer) 32.

The nonmagnetic conductive layer 5 for the positive electrode between the GMR element 4 and the magnetic shield 6 for the positive electrode has a stacked structure of the Ta layer 51, the Cr layer 53 and the Ta layer 51, any of the layers being formed of the first metal material.

In the magnetic field sensor in this Example, the nonmagnetic conductive layer 5 for the positive electrode does not contain any of Au, Ag and Cu classified as the second metal material and, thus, it is possible to prevent the electromigration.

EXAMPLE 4

Figure 4:
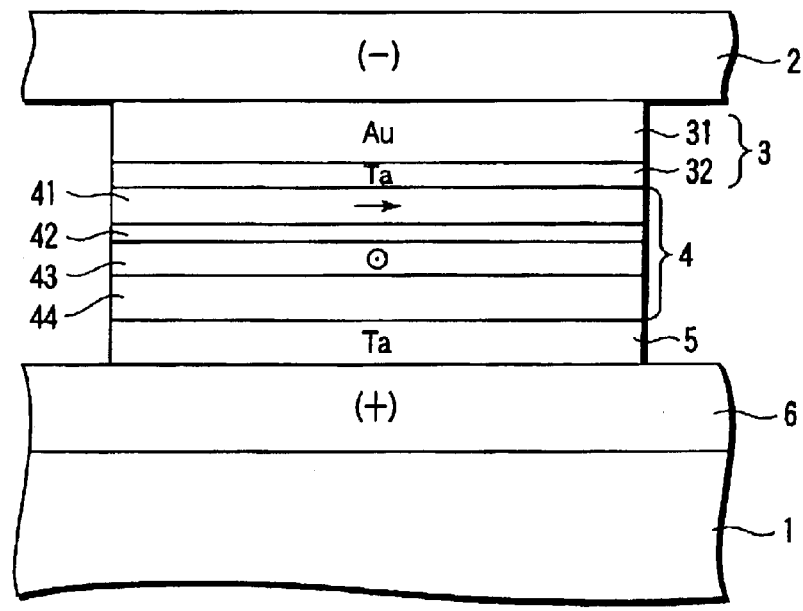
FIG. 4 is a plan view showing the magnetic field sensor according to Example 4 of the present invention.

FIG. 4 is a plan view showing the construction of the magnetic field sensor (shield type magnetoresistive head) in this Example as viewed from the air-bearing surface. As shown in FIG. 4, on the substrate 1 formed of $Al_2O_3$—TiC, the lower magnetic shield 6, the nonmagnetic conductive layer 5, the GMR element 4, the nonmagnetic conductive layer 3, and the upper magnetic shield 2 are formed. In this Example, the lower magnetic shield 6 serves as a positive electrode, and the upper magnetic shield 2 serves as a negative electrode.

The GMR element 4 includes the antiferromagnetic layer 44, the magnetization pinned layer 43, the nonmagnetic intermediate layer 42, and the magnetization free layer 41, in which the free layer 41 constitutes the uppermost layer. In this Example, in order to arrange the free layer 41 of the GMR element 4 in the central portion of the gap between the magnetic shield 6 for the positive electrode and the magnetic shield 2 for the negative electrode, the antiferromagnetic layer 44 is formed sufficiently thick.

The nonmagnetic conductive layer 5 for the negative electrode between the magnetic shield 6 for the positive electrode and the GMR element 4 is a single layer of Ta having a thickness of 5 nm.

The nonmagnetic conductive layer 3 for the negative electrode between the GMR element 4 and the magnetic shield 2 for the negative electrode has a stacked structure of the Ta layer (first metal layer) 32 and the Au layer (second metal layer) 31. The thickness of the Ta layer 32 was set at 3 nm, and the thickness of the Au layer 31 was set at 15 nm or 45 nm.

In the magnetic field sensor in this Example, the nonmagnetic conductive layer 5 for the positive electrode does not contain any of Au, Ag and Cu as the second metal material and, thus, it is possible to prevent the electromigration.

EXAMPLE 5

Figure 5:
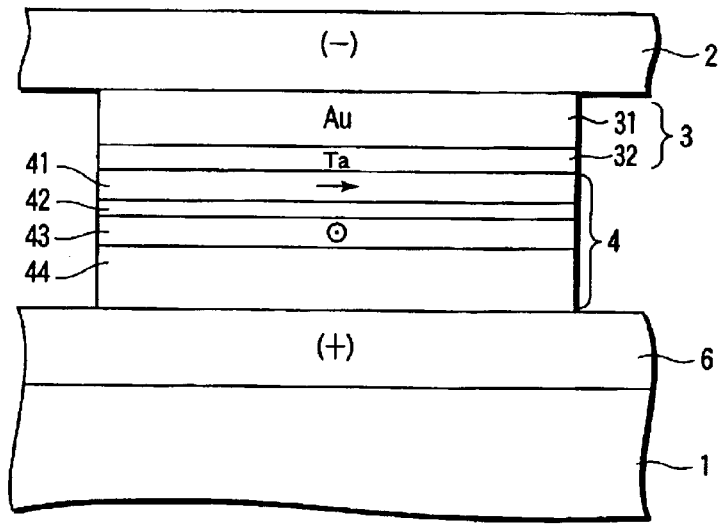
FIG. 5 is a plan view showing the magnetic field sensor according to Example 5 of the present invention.

FIG. 5 is a plan view showing the construction of the magnetic field sensor (shield type magnetoresistive head) in this Example as viewed from the air-bearing surface. As shown in FIG. 5, on the substrate 1 formed of $Al_2O_3$—TiC, the lower magnetic shield 6, the GMR element 4, the nonmagnetic conductive layer 3, and the upper magnetic shield 2 are formed. In this Example, the lower magnetic shield 6 serves as a positive electrode, and the upper magnetic shield 2 serves as a negative electrode.

The GMR element 4 includes the antiferromagnetic layer 44, the magnetization pinned layer 43, the nonmagnetic intermediate layer 42, and the magnetization free layer 41, in which the antiferromagnetic layer 44 is in direct contact with the magnetic shield 6 for the positive electrode and the free layer 41 constitutes the uppermost layer. In this Example, in order to arrange the free layer 41 of the GMR element 4 in the central portion of the gap between the magnetic shield 6 for the positive electrode and the magnetic shield 2 for the negative electrode, the antiferromagnetic layer 44 is formed sufficiently thick.

The nonmagnetic conductive layer 3 for the negative electrode between the GMR element 4 and the magnetic shield 2 for the negative electrode has a stacked structure of the Ta layer (first metal layer) 32 and the Au layer (second metal layer) 31, in which the Au layer 31 is formed thicker than the Ta layer 32.

The magnetic field sensor in this Example does not include a nonmagnetic conductive layer for the positive electrode and, thus, it is possible to prevent the electromigration.

EXAMPLE 6

Figure 6:
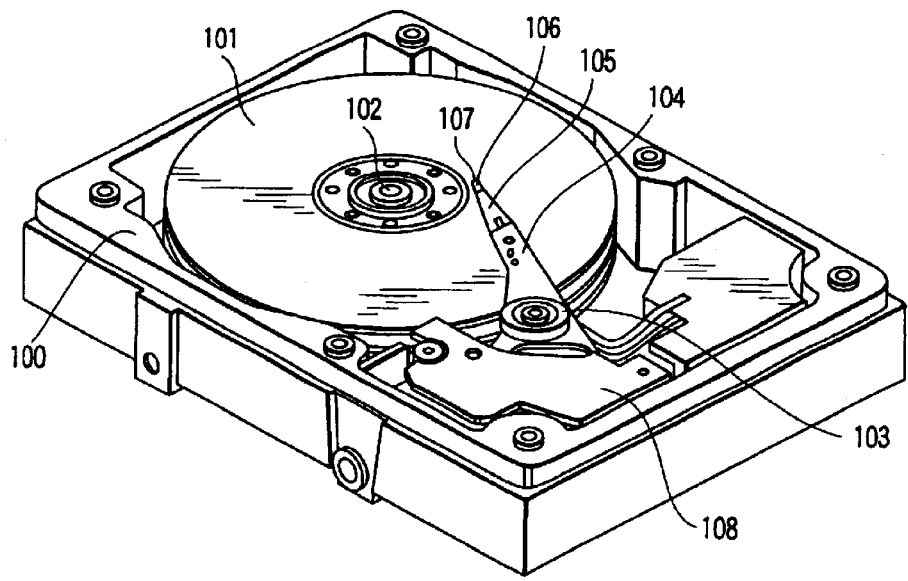
FIG. 6 is a perspective view showing the construction of the magnetic disk apparatus according to Example 6 of the present invention.

FIG. 6 is a perspective view showing the construction of the magnetic disk apparatus in this Example. As shown in the drawing, within the casing 100, the magnetic disk 101 is mounted to the spindle 102 so as to rotate. On the other hand, the arm 104, the suspension 105 and the slider 106 are mounted to the pivot 103 in the vicinity of the magnetic disk 101. The magnetic head 107 including a reproduction head and a recording head is formed in the tip of the slider 106. The arm 104 can be moved in the radial direction of the magnetic disk 101 by means of the voice coil motor 108. During recording and reproducing operations, the magnetic head including the reproduction head and the recording head is positioned in a floated state over a target track on the surface of the magnetic disk 101. The magnetic field sensor as described in each of Examples 1 to 5 is used as the reproduction head included in the magnetic head 107.

In the magnetic disk apparatus having such a construction, the reproduction characteristics are not deteriorated even if the apparatus is operated under high temperatures. Naturally, the magnetic disk apparatus of the present invention is excellent in reliability for a long time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic field sensor comprising:
   a pair of magnetic shields arranged apart from each other with a gap and serving as a negative electrode and a positive electrode, respectively;

a magnetoresistive element arranged between the pair of magnetic shields and including a magnetization free layer, a nonmagnetic intermediate layer, a magnetization pinned layer, and an antiferromagnetic layer;

a nonmagnetic conductive layer for the negative electrode arranged between the magnetic shield for the negative electrode and the magnetoresistive element and including a first metal layer formed in contact with the magnetoresistive element and a second metal layer formed in contact with the first metal layer, the first metal layer containing at least one metal selected from the group consisting of Ta, Ti, Cr, V, Mo and W, and the second metal layer containing at least one metal selected from the group consisting of Au, Ag and Cu; and a nonmagnetic conductive layer for the positive electrode arranged between the magnetic shield for the positive electrode and the magnetoresistive element and including a first metal layer formed in contact with the magnetoresistive element and a second metal layer formed in contact with the first metal layer, the first metal layer containing at least one metal selected from the group consisting of Ta, Ti, Cr, V, Mo and W, the second metal layer containing at least one metal selected from the group consisting of Au, Ag and Cu, and the thickness of the first metal layer being 1 nm or less and the thickness of the second metal layer being not greater than that of the first metal layer.

2. The magnetic field sensor according to claim 1, wherein the second metal layer is formed thicker than the first metal layer in the nonmagnetic conductive layer for the negative electrode.

3. The magnetic field sensor according to claim 2, wherein the nonmagnetic conductive layer for the negative electrode includes a second metal layer formed of Au and a first metal layer formed of Ta.

4. The magnetic field sensor according to claim 1, wherein the nonmagnetic conductive layer for the positive electrode includes a second metal layer formed of Au and a first metal layer formed of Ta.

5. A magnetic field sensor, comprising:

a pair of magnetic shields arranged apart from each other with a gap and serving as a negative electrode and a positive electrode, respectively;

a magnetoresistive element arranged between the pair of magnetic shields and including a magnetization free layer, a nonmagnetic intermediate layer, a magnetization pinned layer, and an antiferromagnetic layer;

a nonmagnetic conductive layer for the negative electrode arranged between the magnetic shield for the negative electrode and the magnetoresistive element and including a first metal layer formed in contact with the magnetoresistive element and a second metal layer formed in contact with the first metal layer, the first metal layer containing at least one metal selected from the group consisting of Ta, Ti, Cr, V, Mo and W, and the second metal layer containing at least one metal selected from the group consisting of Au, Ag and Cu; and a nonmagnetic conductive layer for the positive electrode arranged between the magnetic shield for the positive electrode and the magnetoresistive element and including a first metal layer formed in contact with the magnetoresistive element and a second metal layer formed in contact with the first metal layer, the first metal layer containing at least one metal selected from the group consisting of Ta, Ti, Cr, V, Mo and W, the second metal layer containing at least one metal selected from the group consisting of Au, Ag and Cu, and the thickness of the first metal layer falling within a range of between 1 nm and 10 nm and the thickness of the second metal layer being not greater than the square of the thickness of the first metal layer divided by two.

6. The magnetic field sensor according to claim 5, wherein the second metal layer is formed thicker than the first metal layer in the nonmagnetic conductive layer for the negative electrode.

7. The magnetic field sensor according to claim 6, wherein the nonmagnetic conductive layer for the negative electrode includes a second metal layer formed of Au and a first metal layer formed of Ta.

8. The magnetic field sensor according to claim 5, wherein nonmagnetic conductive layer for the positive electrode includes a second metal layer formed of Au and a first metal layer formed of Ta.

9. A magnetic disk apparatus, comprising:

a magnetic disk; and a magnetic field sensor according to claim 1 arranged so as to face the magnetic disk.

10. A magnetic disk apparatus, comprising:

a magnetic disk; and a magnetic field sensor according to claim 5 arranged so as to face the magnetic disk.

* * * * *